United States Patent
Wang et al.

(10) Patent No.: US 10,976,281 B2
(45) Date of Patent: Apr. 13, 2021

(54) CHEMICAL SENSING UNIT, CHEMICAL SENSOR, AND CHEMICAL SENSING DEVICE ELECTRICALLY COUPLED TO LIGHT EMITTING DIODE

(71) Applicants: Hefei Xinsheng Optoelectronics Technology Co., Ltd., Hefei (CN); BOE TECHNOLOGY GROUP CO., LTD., Beijing (CN)

(72) Inventors: Qinghe Wang, Beijing (CN); Liangchen Yan, Beijing (CN); Dongfang Wang, Beijing (CN); Tongshang Su, Beijing (CN); Leilei Cheng, Beijing (CN); Yongchao Huang, Beijing (CN); Yang Zhang, Beijing (CN); Guangyao Li, Beijing (CN); Guangcai Yuan, Beijing (CN)

(73) Assignees: Hefei Xinsheng Optoelectronics Technology Co., Ltd., Hefei (CN); BOE TECHNOLOGY GROUP CO., LTD., Beijing (CN)

( * ) Notice: Subject to any disclaimer, the term of this patent is extended or adjusted under 35 U.S.C. 154(b) by 55 days.

(21) Appl. No.: 16/453,637

(22) Filed: Jun. 26, 2019

(65) Prior Publication Data
US 2020/0033290 A1 Jan. 30, 2020

(30) Foreign Application Priority Data

Jul. 24, 2018 (CN) .......................... 201810825234.8

(51) Int. Cl.
*G01N 27/414* (2006.01)
*H01L 27/32* (2006.01)
*H01L 51/00* (2006.01)

(52) U.S. Cl.
CPC ....... *G01N 27/414* (2013.01); *H01L 27/3225* (2013.01); *H01L 51/0055* (2013.01)

(58) Field of Classification Search
CPC .............. G01N 27/414; H01L 27/3225; H01L 51/0055
See application file for complete search history.

(56) References Cited

U.S. PATENT DOCUMENTS

2005/0247961 A1* 11/2005 Zhou .................. G01N 27/4146
257/213
2005/0247978 A1 11/2005 Weng et al.
(Continued)

FOREIGN PATENT DOCUMENTS

| CN | 101740604 A | 6/2010 |
|---|---|---|
| CN | 101231258 B | 10/2010 |

(Continued)

OTHER PUBLICATIONS

1st Office Action dated Aug. 27, 2020 for Chinese Patent Application No. 201810825234.8.

*Primary Examiner* — Michael Jung
(74) *Attorney, Agent, or Firm* — Thomas Horstemeyer, LLP (57) ABSTRACT

Embodiments of the present disclosure relate to the field of electronic sensing technologies, and provide a chemical sensing unit, a chemical sensor, and a chemical sensing device. The chemical sensing unit includes a thin film transistor arranged on a substrate, and a light emitting diode coupled to the thin film transistor. The thin film transistor includes a semiconductor active layer, a source, and a drain, and the semiconductor active layer is mainly composed of a chemically sensitive semiconductor material. The chemical sensing unit is provided with a via hole in a region between the source and the drain, such that the semiconductor active layer is exposed at a position corresponding to the via hole.

(Continued)

The light emitting diode includes a first electrode, a light-emitting functional layer, and a second electrode which are stacked in sequence, wherein the first electrode is coupled to the drain.

18 Claims, 4 Drawing Sheets

(56) References Cited

U.S. PATENT DOCUMENTS

| | | | | |
|---|---|---|---|---|
| 2014/0264515 | A1* | 9/2014 | Fabiano | H01L 29/66477 257/295 |
| 2018/0035934 | A1* | 2/2018 | Kiani | H01L 21/02425 |
| 2018/0180584 | A1* | 6/2018 | Katz | H01L 51/0034 |
| 2018/0219160 | A1* | 8/2018 | Tokito | H01L 51/0071 |
| 2020/0093429 | A1* | 3/2020 | Star | C01B 32/198 |

FOREIGN PATENT DOCUMENTS

| | | |
|---|---|---|
| CN | 102301227 A | 12/2011 |
| CN | 102507659 A | 6/2012 |
| CN | 102636552 A | 8/2012 |
| CN | 103000638 A | 3/2013 |
| CN | 103681773 A | 3/2014 |
| CN | 103884744 A | 6/2014 |
| CN | 102263134 B | 12/2014 |
| CN | 105607369 A | 5/2016 |
| CN | 107064272 B | 11/2019 |

\* cited by examiner

CHEMICAL SENSING UNIT, CHEMICAL SENSOR, AND CHEMICAL SENSING DEVICE ELECTRICALLY COUPLED TO LIGHT EMITTING DIODE

CROSS-REFERENCE TO RELATED APPLICATION

This application is based upon, claims the benefit of, and claims priority to Chinese Patent Application No. 201810825234.8, filed on Jul. 24, 2018, where the entire contents thereof are incorporated herein by reference.

TECHNICAL FIELD

The present disclosure relates to the field of electronic sensing technologies and, more particularly, to a chemical sensing unit, a chemical sensor, and a chemical sensing device.

BACKGROUND

Chemical sensors are instruments that are sensitive to various chemical substances and convert their concentrations into electrical signals for detection. Analogous to human sensory organs, the chemical sensors generally correspond to human olfactory and gustatory organs, but are not simple simulations of human organs, and they can sense some substances imperceptible to human organs, such as $H_2$ or CO.

In recent years, with the development of the Internet of Things (IoT) and information technologies, sensors have been developed rapidly, and the chemical sensors have been developed from traditional signal detection to multi-functionality, flexibility, small size, and high precision.

SUMMARY

Embodiments of the present disclosure provide a chemical sensing unit, a chemical sensor, and a chemical sensing device.

The embodiments of the present disclosure provide a chemical sensing unit, which includes a thin film transistor arranged on a substrate, and a light emitting diode coupled to the thin film transistor. The thin film transistor includes a semiconductor active layer, a source, and a drain, and the semiconductor active layer is mainly composed of a chemically sensitive semiconductor material. The chemical sensing unit is provided with a via hole in a region between the source and the drain, such that the semiconductor active layer is exposed at a position corresponding to the via hole. The light emitting diode includes a first electrode, a light-emitting functional layer, and a second electrode which are stacked in sequence, and the first electrode is coupled to the drain.

According to some embodiments of the present disclosure, the first electrode and the drain are positioned in the same layer and made of the same material.

According to some embodiments of the present disclosure, the thin film transistor includes a gate, a gate insulating layer, the semiconductor active layer, the source, an interlayer insulating layer, and the drain, which are sequentially arranged in a direction away from the substrate. The source includes a source auxiliary portion and a source body coupled to the source auxiliary portion. The drain includes a drain auxiliary portion and a drain body coupled to the drain auxiliary portion. A projection of the source auxiliary portion on the substrate is overlapped with a projection of the drain auxiliary portion on the substrate, and a projection of the source body on the substrate is not overlapped with a projection of the drain body on the substrate. Both the source body and the drain body are in contact with the semiconductor active layer, and the source body is coupled to the drain body via the semiconductor active layer. The via hole is positioned in a region between the source body and the drain body.

According to some embodiments of the present disclosure, the light-emitting functional layer includes a first semiconductor layer, a light emitting layer, and a second semiconductor layer, which are sequentially arranged in a direction away from the substrate. One of the first semiconductor layer and the second semiconductor layer is an N-type semiconductor layer, and the other one is a P-type semiconductor layer. The first semiconductor layer and the semiconductor active layer are positioned in the same layer and made of the same material.

According to some embodiments of the present disclosure, the first semiconductor layer and the semiconductor active layer are coupled into an integral structure; and/or the second electrode and the gate are positioned in the same layer and made of the same material.

According to some embodiments of the present disclosure, in the thin film transistor, the source body includes a first source body and a second source body respectively coupled to two opposite ends of the source auxiliary portion in a first direction. The drain body includes a first drain body and a second drain body which are positioned on the same side of the source in a second direction, spaced from each other in the first direction and coupled to the drain auxiliary portion, and the first direction is perpendicular to the second direction. The light-emitting functional layer of the light emitting diode is arranged in a region between the first drain body and the second drain body, and the first electrode of the light emitting diode is coupled to the first drain body, the second drain body and the drain auxiliary portion to form a planar integral structure. The first source body is coupled to the first drain body via the semiconductor active layer, and the second source body is coupled to the second drain body via the semiconductor active layer. The via hole includes a first via hole positioned in a region between the first source body and the first drain body, and a second via hole positioned in a region between the second source body and the second drain body.

According to some embodiments of the present disclosure, the drain body further includes a third drain body and a fourth drain body which are positioned on a side of the source opposite to the first drain body and the second drain body in the second direction, spaced from each other in the first direction and coupled to the drain auxiliary portion. The light-emitting functional layer of the light emitting diode is arranged in a region between the third drain body and the fourth drain body, and the first electrode of the light emitting diode is coupled to the third drain body, the fourth drain body, and the drain auxiliary portion to form a planar integral structure. The first source body is coupled to the third drain body via the semiconductor active layer, and the second source body is coupled to the fourth drain body via the semiconductor active layer. The via hole further includes a third via hole positioned in a region between the first source body and the third drain body, and a fourth via hole positioned in a region between the second source body and the fourth drain body.

According to some embodiments of the present disclosure, the chemically sensitive semiconductor material is copper phthalocyanine or pentacene.

Another aspect of the embodiments of the present disclosure also provides a chemical sensor, which includes the foregoing chemical sensing unit.

Still another aspect of the embodiments of the present disclosure also provides a chemical sensing device, which includes the foregoing chemical sensing unit.

According to some embodiments of the present disclosure, the chemical sensing device includes a plurality of chemical sensing units arranged in a matrix; and a light emitting diode in each of the chemical sensing units constitutes a light emitting unit of a sub-pixel in a display panel.

BRIEF DESCRIPTION OF THE DRAWINGS

To describe the technical solutions of the embodiments of the present disclosure or that of the prior art more clearly, the accompanying drawings required for describing the embodiments or the prior art will be briefly introduced below. Understandably, the accompanying drawings in the following description are merely some embodiments of the present disclosure. To those of ordinary skills in the art, other accompanying drawings may also be derived from these accompanying drawings without creative effort.

DETAILED DESCRIPTION

Technical solutions in the embodiments of the present disclosure will be described clearly and completely below in conjunction with the accompanying drawings in the embodiments of the present disclosure. Understandably, the described embodiments are some but not all of the embodiments of the present disclosure. All other embodiments obtained by those of ordinary skills in the art based on the embodiments of the present disclosure without creative effort shall fall within the protection scope of the present disclosure.

Unless otherwise defined, all the technical terms or scientific terms used in the embodiments of the present disclosure have the same meanings as commonly understood by one of ordinary skill in the art to which the present disclosure belongs. The terms "first", "second", and so on used in the embodiments of the present disclosure do not denote any sequence, quantity, or importance, but instead are merely intended to distinguish different constituent parts. The terms "comprise" or "include" and so on are intended to specify that the elements or the objects stated before these terms encompass the elements or the objects and equivalents thereof listed after these terms, but do not preclude the other elements or objects. The terms "connect" or "connection" and so on are not limited to physical or mechanical connection, and also may include electrical connection, either directly or indirectly. "On," "under," "right," "left" and the like are only used to indicate relative position relationship, and when the absolute position of the object which is described is changed, the relative position relationship may be changed accordingly.

The embodiments of the present disclosure provide a chemical sensing unit which includes a thin film transistor arranged on a substrate, and a light emitting diode coupled to the thin film transistor.

The thin film transistor includes a semiconductor active layer, a source, and a drain. The semiconductor active layer is mainly composed of a chemically sensitive semiconductor material. The light emitting diode includes a first electrode, a light-emitting functional layer, and a second electrode which are stacked in sequence, and the first electrode is coupled to the drain.

Furthermore, the chemical sensing unit is provided with a via hole in a region between the source and the drain such that the semiconductor active layer is exposed at a position corresponding to the via hole. That is, the chemical sensing unit is provided with a via hole in a region corresponding to the channel of the thin film transistor, so as to ensure that gases to be detected are in contact with the channel through the via hole. Of course, the size and the shape or the like of the via hole are not specifically limited in the present disclosure, which may be selected as needed in practice.

It is to be understood that, based on an actual design layout, the first electrode, the light-emitting functional layer, and the second electrode (which are stacked in sequence) either may be the first electrode, the light-emitting functional layer, and the second electrode which are stacked in sequence away from the substrate, or may be the first electrode, the light-emitting functional layer, and the second electrode which are stacked in sequence close to the substrate, which are not specifically limited in the present disclosure and may be selected as needed in practice.

On this basis, since the first electrode of the light emitting diode is coupled to the drain of the thin film transistor, in practice, to simplify processes and reduce fabrication costs, according to some embodiments of the present disclosure, the first electrode of the light emitting diode and the drain of the thin film transistor are positioned in the same layer and made of the same material. That is, the first electrode and the drain are coupled into an integral structure using one-step fabrication technology. The present disclosure is further described in the following based on this example.

Thus, when gases to be detected with different concentrations are in contact with the semiconductor active layer through the via hole, the channel carrier transport rate of the thin film transistor can be changed, a drive signal (such as a current signal) of the light emitting diode coupled to the drain of the thin film transistor may be changed, and thus, the brightness of the light emitting diode may be changed. On this basis, it is to be understood that by using the chemical sensing unit in the present disclosure, the concentration of the detected chemical gas can be directly reflected through the brightness of the light emitting diode. That is, the chemical sensing unit of the present disclosure can implement the visualization of chemical sensing.

Further, in the present disclosure, the chemically sensitive semiconductor material constituting the semiconductor active layer is not particularly limited. For example, the chemically sensitive semiconductor material may be copper phthalocyanine, pentacene, or the like which are sensitive to ammonia gas.

It is to be noted that in the present disclosure, neither the type and the arrangement of the thin film transistor in the chemical sensing unit nor the arrangement of the light emitting diode is specifically limited. In practice, the type of the thin film transistor may be appropriately selected as required. Schematically, the following embodiments provide a specific structure of a thin film transistor and a light emitting diode in a chemical sensing unit.

Specifically, the thin film transistor 10 arranged on the substrate 01 and the light emitting diode 20 coupled to the thin film transistor 10 in the chemical sensing unit 001 (referring to FIG. 1) in the present disclosure are further described with reference to FIG. 1 and FIG. 2 (a schematic cross-sectional view along A1-A2-A3 in FIG. 1) and FIG. 3 (a schematic cross-sectional view along B1-B2-B3 in FIG. 1).

Figure 1:
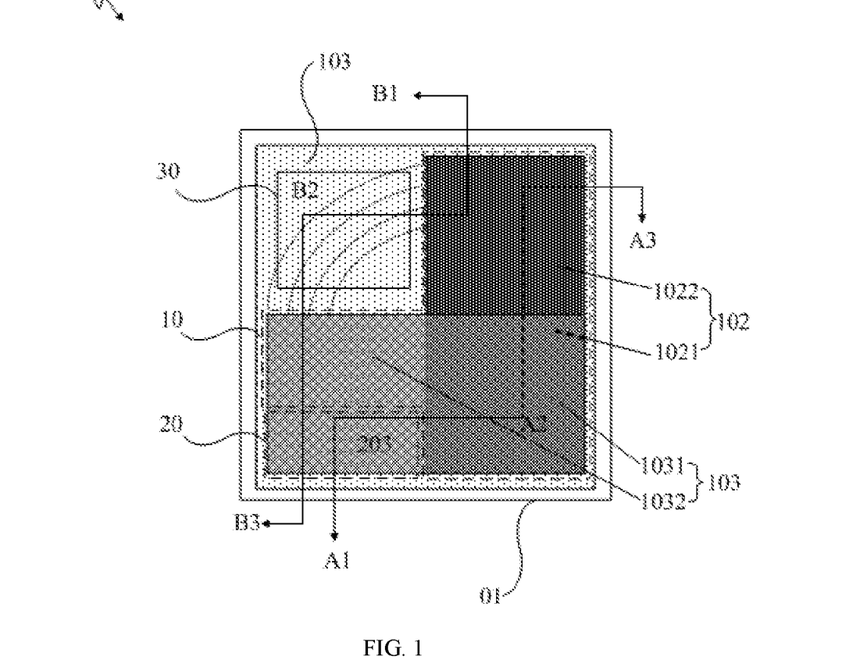
FIG. 1 is a schematic structural diagram of a chemical sensing unit according to an embodiment of the present disclosure.
Figure 2:
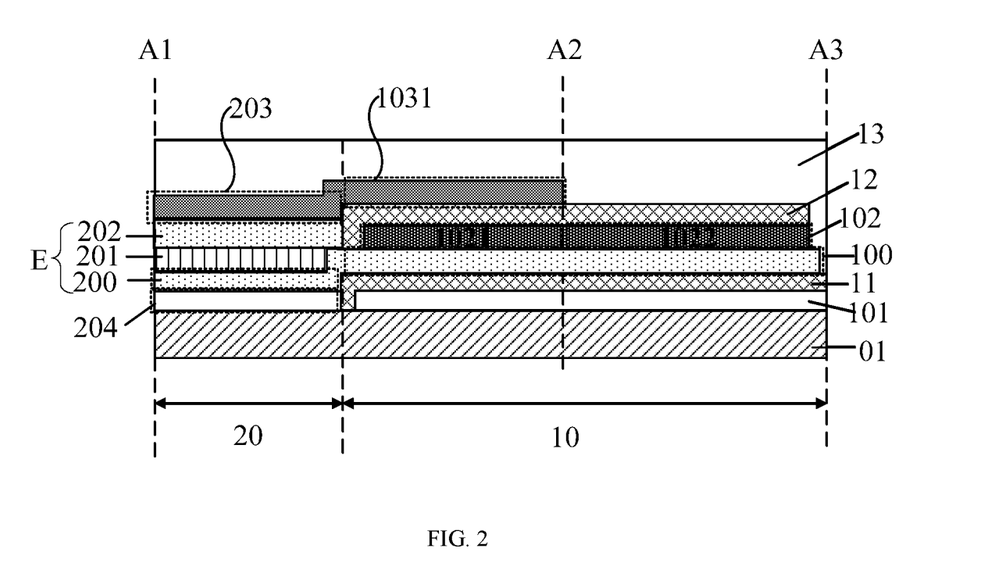
FIG. 2 is a schematic cross-sectional view along A1-A2-A3 in FIG. 1.

Referring to FIG. 1 and FIG. 2 (the portion of the thin film transistor 10), the thin film transistor 10 includes a gate 101, a gate insulating layer 11, a semiconductor active layer 100, a source 102, an interlayer insulating layer 12, and a drain 103 which are sequentially arranged in a direction away from the substrate 01.

Referring to FIG. 1, the source 102 includes a source auxiliary portion 1021 and a source body 1022 coupled to the source auxiliary portion 1021 (in consideration of actual fabrication processes. The source auxiliary portion 1021 and the source body 1022 are positioned in the same layer and made of the same material, and are coupled into an integral structure). The drain 103 includes a drain auxiliary portion 1031 and a drain body 1032 coupled to the drain auxiliary portion 1031 (in consideration of the actual fabrication processes, the drain auxiliary portion 1031 and the drain body 1032 are positioned in the same layer and made of the same material, and are coupled into an integral structure).

Moreover, a projection of the source auxiliary portion 1021 on the substrate 01 is overlapped with a projection of the drain auxiliary portion 1031 on the substrate 01 (referring to FIG. 2), and a projection of the source body 1022 on the substrate 01 is not overlapped with a projection of the drain body 1032 on the substrate 01 (referring to FIG. 1).

Figure 3:
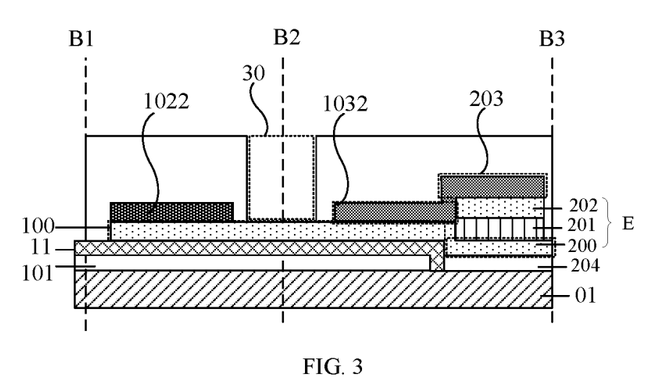
FIG. 3 is a schematic cross-sectional view along B1-B2-B3 in FIG. 1.

In addition, referring to FIG. 1 and FIG. 3, the source body 1022 and the drain body 1032 are both in contact with the semiconductor active layer 100, and are coupled to each other through the semiconductor active layer 100. A via hole 30 is positioned in a region between the source body 1022 and the drain body 1032 (i.e., the via hole 30 is positioned at the channel position of the thin film transistor 10).

It is to be understood that in the present disclosure, the gas to be detected is in contact with the semiconductor active layer 100 through the via hole 30. Therefore, each film layer at the side of the semiconductor active layer 100 in the chemical sensing unit facing away from the substrate 01 has a hollow pattern (via hole) in the position of the via hole 30, to ensure that the gas to be detected can be in contact with the semiconductor active layer 100 through the via hole 30, such that the channel carrier transport rate of the thin film transistor can be changed, the drive signal of the light emitting diode coupled to the drain of the thin film transistor may be changed, and thus, the brightness of the light emitting diode may be changed.

On this basis, the light emitting diode 20 includes the first electrode, the light-emitting functional layer, and the second electrode which are stacked in sequence, and the first electrode is coupled to the drain of the thin film transistor.

Referring to FIG. 1, the first electrode 203 is actually arranged in parallel with the drain body 1032 in the drain 103 of the thin film transistor 10, and is coupled to both the drain auxiliary portion 1031 and the drain body 1032 in the drain 103 to form an integral planar structure.

Of course, to simplify the fabrication costs, for the second electrode 204 in the light emitting diode 20, according to some embodiments of the present disclosure, as shown in FIG. 2 or FIG. 3, the second electrode 204 and the gate 101 are positioned in the same layer and made of the same material (but not electrically coupled). That is, the second electrode 204 and the gate 101 are fabricated by the same fabrication process.

In addition, as shown in FIG. 2 or FIG. 3, the light-emitting functional layer E in the light emitting diode 20 includes a first semiconductor layer 200, a light emitting layer 201, and a second semiconductor layer 202 which are sequentially arranged in a direction away from the substrate 01. One of the first semiconductor layer 200 and the second semiconductor layer 202 is an N-type semiconductor layer, and the other one is a P-type semiconductor layer.

In practice, in order to simplify the processes and reduce the fabrication costs, as shown in FIG. 2 or FIG. 3, according to some embodiments of the present disclosure, the first semiconductor layer 200 and the semiconductor active layer 100 are positioned in the same layer and made of the same material. That is, the first semiconductor layer 200 and the semiconductor active layer 100 are fabricated by the same fabrication process. In practice, the first semiconductor layer 200 and the semiconductor active layer 100 may be coupled into an integral structure. Schematically, in the following embodiments, the first semiconductor layer 200 is a P-type semiconductor layer and is made of a pentacene material. That is, the semiconductor active layer 100 is also made of the pentacene material.

On this basis, in order to improve the sensitivity of detecting a chemical gas by the chemical sensing unit, to visually reflect the concentration of the chemical gas by effectively changing the brightness of the light emitting diode, according to some embodiments of the present disclosure, the thin film transistor may be provided with a plurality of channel regions, and each of the channel regions (i.e., the region between the source body 1022 and the drain body 1032) is provided with a via hole 30.

Figure 4:
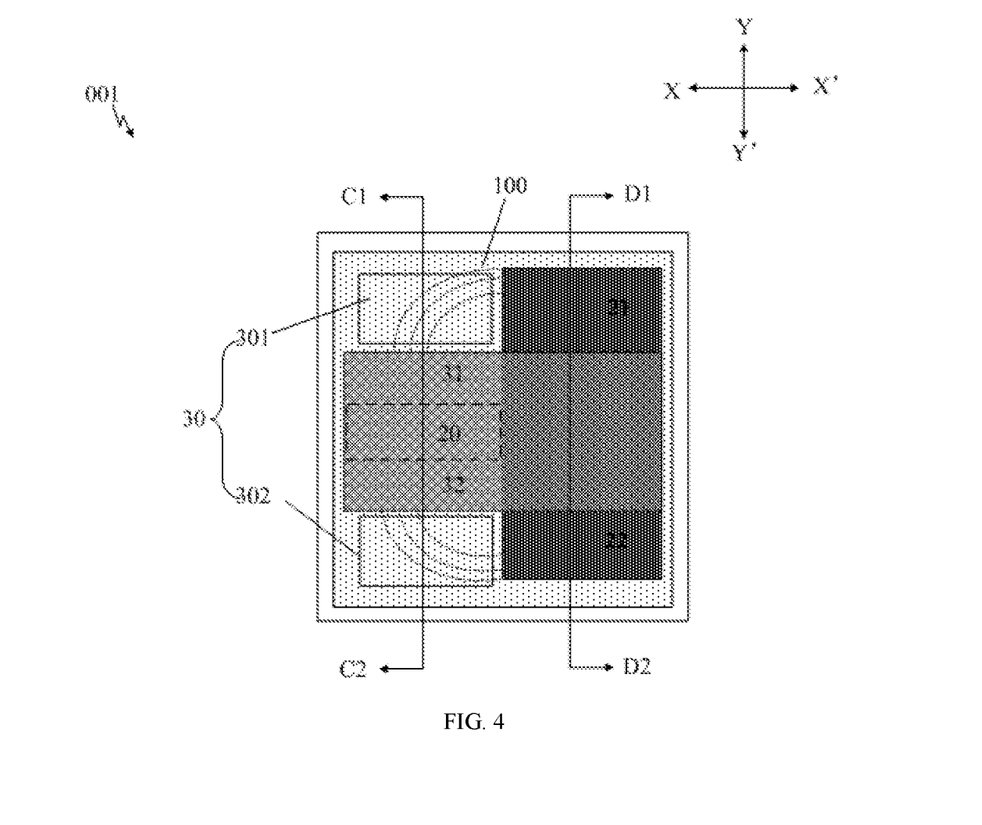
FIG. 4 is a schematic structural diagram of another chemical sensing unit according to an embodiment of the present disclosure.
Figure 5:
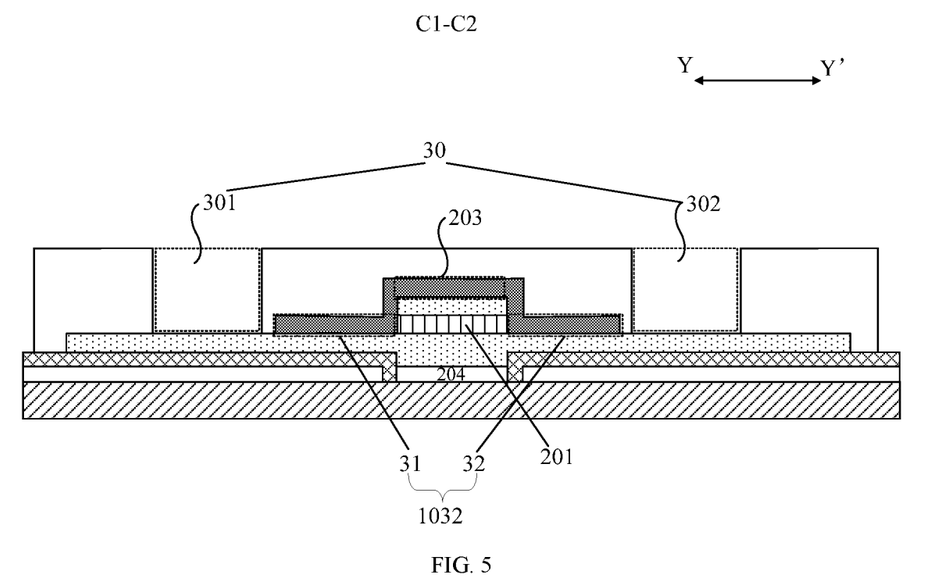
FIG. 5 is a schematic cross-sectional view along C1-C2 in FIG. 4.

Specifically, as shown in FIG. 4, FIG. 5 (a cross-sectional view along C1-C2 in FIG. 4) and FIG. 6 (across-sectional view along D1-D2 in FIG. 4), the thin film transistor 10 will be described below.

Figure 6:
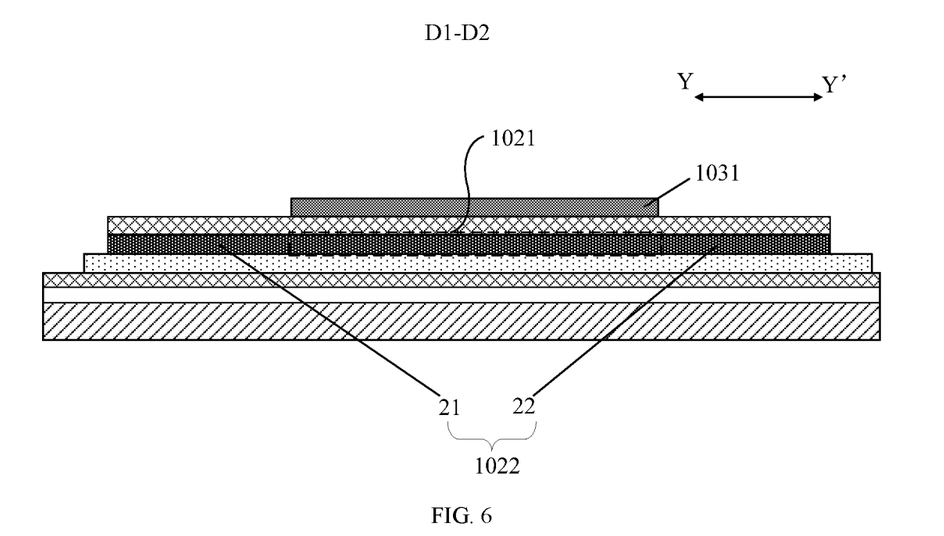
FIG. 6 is a schematic cross-sectional view along 1-D2 in FIG. 4.

With reference to FIG. 6 and FIG. 4, the source body 1022 includes a first source body 21 and a second source body 22 respectively coupled to two opposite ends of the source auxiliary portion 1021 in a first direction Y-Y'.

With reference to FIG. 5 and FIG. 4, the drain body 1032 includes a first drain body 31 and a second drain body 32, which are positioned on the same side of the source 102 in the second direction X-X', spaced from each other in the first direction Y-Y' and coupled to the drain auxiliary portion 1031. A region between the first drain body 31 and the second drain body 32 is provided with a light-emitting functional layer (the light-emitting functional layer is actually defined by the light emitting layer 201) of the light emitting diode. Moreover, a first electrode 203 of the light emitting diode 20 is coupled to the first drain body 31, the second drain body 32 and the drain auxiliary portion 1031 to form a planar integral structure.

In this case, referring to FIG. 4, the first source body 21 is coupled to the first drain body 31 via the semiconductor active layer 100, and the second source body 22 is coupled to the second drain body 32 via the semiconductor active layer 100. Referring to FIG. 4 and FIG. 5, the via hole 30 includes a first via hole 301 positioned in a region between the first source body 21 and the first drain body 31, and a second via hole 302 positioned in a region between the second source body 22 and the second drain body 32.

In view of an actual layout, according to some embodiments of the present disclosure, the first direction Y-Y' is perpendicular to the second direction X-X', but is not limited thereto.

In this way, for the above thin film transistor, the first source body 21 and the first drain body 31 form a channel, and the second source body 22 and the second drain body 32 also form a channel (as shown in the arc-shaped dotted line positions in FIG. 4). The first via hole 301 and the second via hole 302 are respectively arranged at the two channels, such that the chemical gas to be detected can contact the semiconductor active layer through the via holes at the two channel positions, thereby improving the effect of the detected chemical gas on the channel carrier transport rate. That is, the sensitivity of detecting the chemical gas by the chemical sensing unit is improved.

Figure 7:
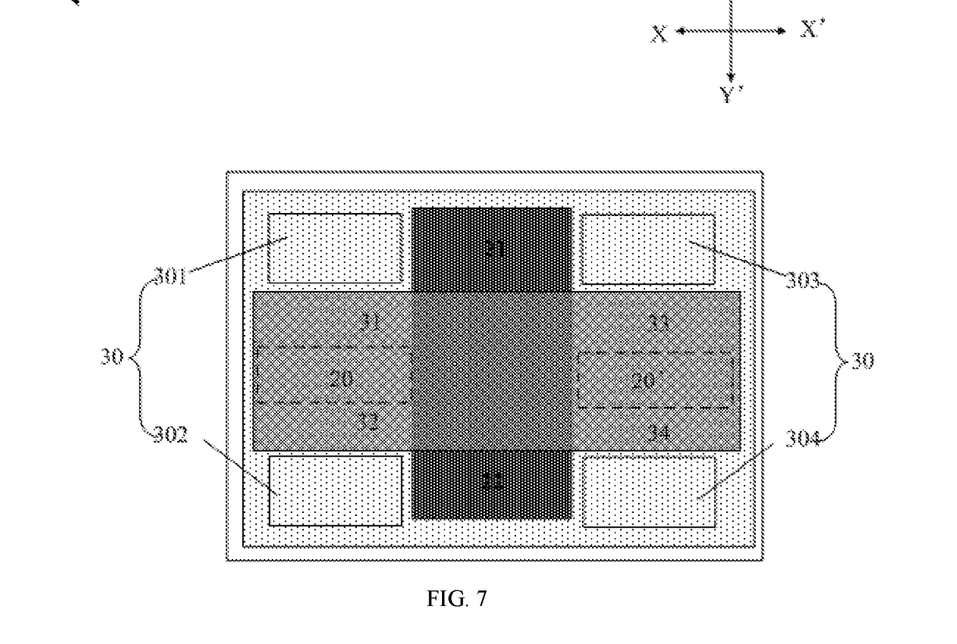
FIG. 7 is a schematic structural diagram of still another chemical sensing unit according to an embodiment of the present disclosure.

On this basis, in order to further improve the sensitivity of detecting the chemical gas by the chemical sensing unit, as shown in FIG. 7, the drain body 1032 further includes a third drain body 33 and a fourth drain body 34 (cross-sectional view, schematically referring to FIG. 5), which are positioned on the side of the source opposite to the first drain body 31 and the second drain body 32 in the second direction X-X', spaced from each other in the first direction Y-Y' and coupled to the drain auxiliary portion 1031. A region between the third drain body 33 and the fourth drain body 34 is provided with a light-emitting functional layer (the light-emitting functional layer is actually defined by the light emitting layer 201) of the light emitting diode 20'. Moreover, a first electrode 203 of the light emitting diode 20' is coupled to the third drain body 33, the fourth drain body 34 and the drain auxiliary portion 1031 to form a planar integral structure.

Moreover, the first source body 21 is coupled to the third drain body 33 via the semiconductor active layer 100, and the second source body 22 is coupled to the fourth drain body 34 via the semiconductor active layer 100. In this case and on this basis, the via hole 30 also includes a third via hole 303 positioned in a region between the first source body 21 and the third drain body 33, and a fourth via hole 304 positioned in a region between the second source body 22 and the fourth drain body 34.

That is, the thin film transistor in the chemical sensing unit 001 can form four channels, and the first via hole 301, the second via hole 302, the third via hole 303, and the fourth via hole 304 are respectively arranged at the four channels. Meanwhile, the chemical sensing unit 001 is internally provided with two light emitting diodes (20 and 20'), thereby improving the effect of the detected chemical gas on the channel carrier transport rate. That is, the sensitivity of detecting the chemical gas by the chemical sensing unit is improved.

Here it is to be understood that, first, the number of channels in the thin film transistor of the chemical sensing unit is not limited in the present disclosure (of course, the number of the via holes arranged in the channel region is not limited). For example, in FIG. 1, there may be one channel (at the position of the arc-shaped dotted line) and one via hole at the position of this channel. In another example, in FIG. 4, there may be two channels (at the positions of the arc-shaped dotted lines) and two via holes respectively positioned at the positions of the two channels.

Figure 8:
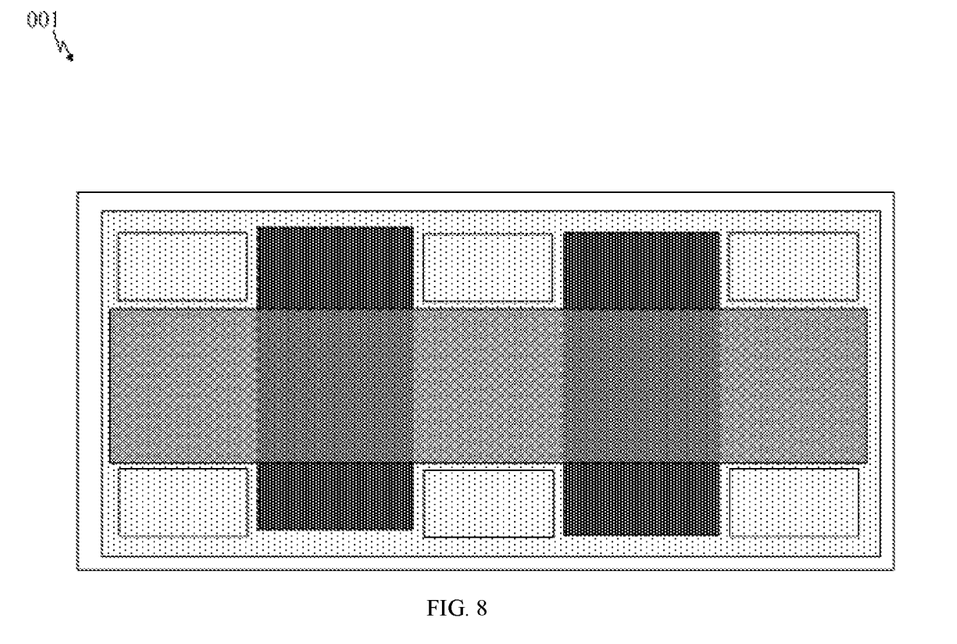
FIG. 8 is a schematic structural diagram of still another chemical sensing unit according to an embodiment of the present disclosure.

Second, in the present disclosure, the number of the thin film transistors and the number of the light emitting diodes in the chemical sensing unit are not limited. For example, as shown in FIG. 1, the chemical sensing unit may include one thin film transistor and one light emitting diode. Alternatively, as shown in FIG. 7, the chemical sensing unit may include one thin film transistor and a plurality of light emitting diodes. Alternatively, as shown in FIG. 8, the chemical sensing unit may include a plurality of thin film transistors and a plurality of light emitting diodes. However, the present disclosure is not limited thereto. In practice, the number of the thin film transistors and the light emitting diodes, and the layouts and the structures or the like thereof may be selected as required.

In addition, in the present disclosure, the fabrication processes and materials of each film layer in the above chemical sensing unit are not specifically limited. In practice, appropriate materials and fabrication processes may be selected according to actual needs for each film layer, which is not for specifically limited in the present disclosure. Schematically, in conjunction with the structure of the chemical sensing unit as shown in FIG. 1-FIG. 3, a specific fabrication process is provided below.

First, the gate 101 and the second electrode 204 of the light emitting diode 20 are formed on the substrate 01 of a PDMS material by way of transfer. Next, the gate insulating layer 11 is formed by using aluminum oxide ($Al_2O_3$) by way of atomic deposition. Next, the semiconductor active layer 100 of the thin film transistor and the first semiconductor layer 200 of the light emitting diode 20 (integral structure) are formed using pentacene (a P-type semiconductor material) sensitive to ammonia gas ($NH_3$) by way of evaporation or ink-jet printing. Next, the source 102 is formed using ITO by way of ink-jet printing and annealing. Next, the light emitting layer 201 is formed by way of ink-jet printing. Next, the interlayer insulating layer 12 is formed using PMMA by way of ink-jet printing. Next, the second semiconductor layer 202 is formed by using copper phthalocyanine (an N-type semiconductor material) by way of ink-jet printing. Next, the drain 103 is formed by deposition. Finally, the encapsulating layer 13 is formed using a superhydrophobic polymer (CYTOP) to encapsulate the entire device and, after the encapsulation is completed, the via hole 30 is formed by using a dry etching process at the position corresponding to the channel to expose the semiconductor active layer at the channel position, such that the detection gas (ammonia gas) can contact the semiconductor active layer at the channel position through the via hole 30. In this way, the visualization sensing of the concentration of the chemical gas may be implemented.

In summary, it is to be understood that, first, in the present disclosure, the channel layer of the thin film transistor is used as a signal response layer to affect the current flowing from the source to the drain through the chemical gas, thereby affecting the light emission intensity of the light emitting portion. Furthermore, the light emitting diode and the thin film transistor share the source layer, the drain layer, and the semiconductor layer, which not only enhances the working efficiency of the device, but also simplifies the fabrication process.

Second, as a new-type chemical sensing unit, the chemical sensing unit in the present disclosure ingeniously utilizes the structure of the device, in which it is designed that the thin film transistor is coupled to the light emitting diode. By virtue of the effect of gas on the semiconductor active layer in the channel position of the thin film transistor, the light emission intensity of the light emitting diode is changed, so as to achieve the objective of obtaining different light emission brightness under the effect of different signal sources, thereby achieving a visualization sensing effect. As a new-type sensing device capable of converting a chemical gas signal into an optical signal, the chemical sensing unit in the present disclosure also may be used as a chemical gas-optical signal converter, and is a multipurpose new-type device.

Third a majority of materials used in forming the chemical sensing unit in the present disclosure are organic materials, which may be prepared into flexible, low-volt and lightweight devices, meeting the development requirements of wearable electronic devices for mainstream electronic devices. Therefore, the chemical sensing unit may be widely used in intelligent sensing (visual specific gas recognition, visual physical light recognition, military special operations, etc.), intelligent health (visualization or strength of certain air components, etc.), artificial intelligence (enriching robot functions, etc.), signal converters (gas-optical signal conversion), etc., thereby contributing to the system construction of the Internet of Things (IoT) and the development of information technologies.

The embodiments of the present disclosure also provide a chemical sensor, which includes the foregoing chemical sensing unit 001. The chemical sensor has the same structure and beneficial effects as the chemical sensing unit provided in the foregoing embodiments. The structure and the beneficial effects of the chemical sensing unit have been described in detail in the foregoing embodiments, and thus their details are omitted herein.

Moreover, the embodiments of the present disclosure also provide a chemical sensing device, which includes the foregoing chemical sensing unit 001. The chemical sensing device likewise has the same structure and beneficial effects as the chemical sensing unit provided in the foregoing embodiments. The structure and the beneficial effects of the chemical sensing unit have been described in detail in the foregoing embodiments, and thus their details are omitted herein.

Schematically, the visualization chemical sensing of the entire chemical sensing device is further described below with reference to the specific working principle of the chemical sensing unit 001.

First, in conjunction with the chemical sensing unit 001 in FIG. 1, in a practical operation, a fixed voltage V1 may be inputted to the source 102 of the thin film transistor 10, another fixed voltage V2 (V1>V2) may be inputted to the second electrode 204 of the light emitting diode 20, and meanwhile a control voltage is supplied to the gate 101 of the thin film transistor 10. At this moment, a current flows through the light emitting diode, such that the light emitting diode 20 is enabled. In this case, the gas to be detected comes into contact with the channel position of the thin film transistor 10 through the via hole 30. As the concentration of the gas to be detected changes, the channel carrier transport rate of the thin film transistor 10 also changes accordingly (for example, if the concentration of the gas to be detected increases, the channel carrier transport rate also increases; of course, it is also possible that the concentration of the gas to be detected increases, but the channel carrier transport rate decreases, depending on the actually chemically sensitive semiconductor material and the gas to be detected), and thus the magnitude of the current flowing through the light emitting diode 20 changes, such that the brightness of the light emitting diode 20 is changed.

On this basis, for the chemical sensing device, one chemical sensing unit 001 may be disposed in the chemical sensing device, such that the brightness of the light emitting diode 20 in the chemical sensing unit 001 may be visually and intuitively observed, so as to detect the variation of the concentration of the gas.

Of course, in the practical production, the chemical sensing device may have a planar sensing plane, a plurality of chemical sensing units 001 are distributed in the sensing plane, and the plurality of chemical sensing units 001 may be independently controlled. Thus, in the practical detection, the same initial signals (including V1, V2, gate voltage, and so on) are inputted into the plurality of chemical sensing units 001, such that the concentration distribution of the gas to be detected may be visually represented by the plurality of chemical sensing units 001.

Specifically, for example, in a certain space, the sensing plane of the chemical sensing device is in a vertical state, and a human eye observes that the light emitting diode below the chemical sensing device is dark, but in the direction from bottom to top, the brightness of the light emitting diode is gradually increased. A user may understand that the concentration distribution of the gas to be detected in this space gradually increases from bottom to top (the higher the concentration is, the larger the carrier mobility is).

Further, the chemical sensing device may also be directly combined with a display device, such that the display device may perform visualization chemical sensing while achieving display.

In this case, the chemical sensing device may include a plurality of chemical sensing units 001 arranged in a matrix, and the light emitting diode 20 in each of the chemical sensing units 001 constitutes a light emitting unit of a sub-pixel in a display panel. The light emitting diode 20 may display while performing visual representation on the concentration of the gas to be detected through brightness variation. That is, the chemical sensing device may directly represent the concentrations of chemical gases in different regions through differences in brightness of different regions in the actual display screen.

It is to be understood here that, while the chemical sensing device is used as the display device, the thin film transistor 10 in the chemical sensing unit 001 is equivalent to a drive transistor in a pixel driving circuit in a sub-pixel. Of course, arrangement of other elements in the pixel driving circuit is not particularly limited in the present disclosure. For example, a conventional 2T1C structure (one switch transistor, one drive transistor, and one capacitor) may be employed.

It is to be also understood here that if the chemical sensing device is used as a display device, in actual fabrication, the proportion of the thin film transistor and the light emitting diode in the chemical sensing unit may be adjusted to control the relative size of a sensing region and a light emitting region. For example, the aperture ratio (i.e., the proportion of the light emitting diode) of the sub-pixel of this device may be adjusted by adjusting the width of an electrode (the source, the drain, or the first electrode). That is, the proportion of the display and sensing regions is adjusted.

In addition, by using the design method of the present disclosure, for example, in the chemical sensing unit as shown in FIG. 2, the light emitting layer in the light emitting diode may be directly defined by the source layer in the thin film transistor, and ultrahigh-resolution high-definition display may be implemented without separately providing a pixel defining layer. Furthermore, the light emitting diode in the present disclosure may be of either a top-emitting or a bottom-emitting, which is not specifically limited in the present disclosure.

The embodiments described above are merely example embodiments of the present disclosure, but the protection scope of the present disclosure is not limited thereto. Any variation or substitution easily conceivable to a person of ordinary skills in the art within the technical scope disclosed in the present disclosure shall fall into the protection scope of the present disclosure. Therefore, the scope of protection of the present disclosure shall be subject to the scope of the claims.

What is claimed is:

1. A chemical sensing unit, comprising:
    a thin film transistor arranged on a substrate, and a light emitting diode coupled to the thin film transistor, wherein:
        the thin film transistor comprises a semiconductor active layer, a source, and a drain, and the semiconductor active layer is formed of a chemically sensitive semiconductor material;
        the chemical sensing unit is provided with a via hole in a region between the source and the drain, such that the semiconductor active layer is exposed at a position corresponding to the via hole;
        the light emitting diode comprises a first electrode, a light-emitting functional layer, and a second electrode which are stacked in sequence, and the first electrode is coupled to the drain;
        the thin film transistor comprises a gate, a gate insulating layer, the semiconductor active layer, the source, an interlayer insulating layer, and the drain, which are sequentially arranged in a direction away from the substrate;
        the source comprises a source auxiliary portion and a source body coupled to the source auxiliary portion, and the drain comprises a drain auxiliary portion and a drain body coupled to the drain auxiliary portion;
        a projection of the source auxiliary portion on the substrate is overlapped with a projection of the drain auxiliary portion on the substrate, and a projection of the source body on the substrate is not overlapped with a projection of the drain body on the substrate;
        both the source body and the drain body are in contact with the semiconductor active layer, and the source body is coupled to the drain body via the semiconductor active layer; and
        the via hole is positioned in a region between the source body and the drain body.

2. The chemical sensing unit according to claim 1, wherein the first electrode and the drain are formed of a same material in a same layer.

3. The chemical sensing unit according to claim 1, wherein:
    the light-emitting functional layer comprises a first semiconductor layer, a light emitting layer, and a second semiconductor layer, which are sequentially arranged in a direction away from the substrate;
    one of the first semiconductor layer and the second semiconductor layer is an N-type semiconductor layer, and the other one is a P-type semiconductor layer; and
    the first semiconductor layer and the semiconductor active layer are formed of a same material in a same layer.

4. The chemical sensing unit according to claim 3, wherein the first semiconductor layer and the semiconductor active layer are coupled into an integral structure.

5. The chemical sensing unit according to claim 3, wherein the second electrode and the gate are formed of a same material in a same layer.

6. The chemical sensing unit according to claim 1, wherein:
    the source body comprises a first source body and a second source body respectively coupled to two opposite ends of the source auxiliary portion in a first direction;
    the drain body comprises a first drain body and a second drain body which are positioned on a same side of the source in a second direction, spaced from each other in the first direction and coupled to the drain auxiliary portion;
    the first direction is perpendicular to the second direction;
    the light-emitting functional layer of the light emitting diode is arranged in a region between the first drain body and the second drain body, the first electrode of the light emitting diode is coupled to the first drain body, the second drain body and the drain auxiliary portion to form a planar integral structure;
    the first source body is coupled to the first drain body via the semiconductor active layer, and the second source body is coupled to the second drain body via the semiconductor active layer; and
    the via hole comprises a first via hole positioned in a region between the first source body and the first drain body, and a second via hole positioned in a region between the second source body and the second drain body.

7. The chemical sensing unit according to claim 6, wherein:
    the drain body further comprises a third drain body and a fourth drain body which are positioned on a side of the source opposite to the first drain body and the second drain body in the second direction, spaced from each other in the first direction and coupled to the drain auxiliary portion;
    the light-emitting functional layer of the light emitting diode is arranged in a region between the third drain body and the fourth drain body, the first electrode of the light emitting diode is coupled to the third drain body, the fourth drain body and the drain auxiliary portion to form a planar integral structure;
    the first source body is coupled to the third drain body via the semiconductor active layer, and the second source body is coupled to the fourth drain body via the semiconductor active layer; and
    the via hole further comprises a third via hole positioned in a region between the first source body and the third drain body, and a fourth via hole positioned in a region between the second source body and the fourth drain body.

8. The chemical sensing unit according to claim 1, wherein the chemically sensitive semiconductor material is one of copper phthalocyanine and pentacene.

9. A chemical sensor, comprising:
    a chemical sensing unit, wherein the chemical sensing unit comprises a thin film transistor arranged on a substrate, and a light emitting diode coupled to the thin film transistor, wherein:

the thin film transistor comprises a semiconductor active layer, a source and a drain, and the semiconductor active layer is mainly formed of a chemically sensitive semiconductor material;

the chemical sensing unit is provided with a via hole in a region between the source and the drain, such that the semiconductor active layer is exposed at a position corresponding to the via hole;

the light emitting diode comprises a first electrode, a light-emitting functional layer and a second electrode which are stacked in sequence, and the first electrode is coupled to the drain;

the thin film transistor comprises a gate, a gate insulating layer, the semiconductor active layer, the source, an interlayer insulating layer, and the drain, which are sequentially arranged in a direction away from the substrate;

the source comprises a source auxiliary portion and a source body coupled to the source auxiliary portion, and the drain comprises a drain auxiliary portion and a drain body coupled to the drain auxiliary portion;

a projection of the source auxiliary portion on the substrate is overlapped with a projection of the drain auxiliary portion on the substrate, and a projection of the source body on the substrate is not overlapped with a projection of the drain body on the substrate;

both the source body and the drain body are in contact with the semiconductor active layer, and the source body is coupled to the drain body via the semiconductor active layer; and the via hole is positioned in a region between the source body and the drain body.

10. The chemical sensor according to claim 9, wherein the first electrode and the drain are formed of a same material in a same layer.

11. The chemical sensor according to claim 9, wherein:
the light-emitting functional layer comprises a first semiconductor layer, a light emitting layer and a second semiconductor layer, which are sequentially arranged in a direction away from the substrate;

one of the first semiconductor layer and the second semiconductor layer is an N-type semiconductor layer, and the other one is a P-type semiconductor layer; and the first semiconductor layer and the semiconductor active layer are formed of a same material in a same layer.

12. The chemical sensor according to claim 11, wherein the first semiconductor layer and the semiconductor active layer are coupled into an integral structure.

13. The chemical sensor according to claim 11, wherein the second electrode and the gate are formed of a same material in a same layer.

14. The chemical sensor according to claim 9, wherein:
the source body comprises a first source body and a second source body respectively coupled to two opposite ends of the source auxiliary portion in a first direction;

the drain body comprises a first drain body and a second drain body which are positioned on a same side of the source in a second direction, spaced from each other in the first direction and coupled to the drain auxiliary portion;

the first direction is perpendicular to the second direction;
the light-emitting functional layer of the light emitting diode is arranged in a region between the first drain body and the second drain body, the first electrode of the light emitting diode is coupled to the first drain body, the second drain body and the drain auxiliary portion to form a planar integral structure;

the first source body is coupled to the first drain body via the semiconductor active layer, and the second source body is coupled to the second drain body via the semiconductor active layer; and the via hole comprises a first via hole positioned in a region between the first source body and the first drain body, and a second via hole positioned in a region between the second source body and the second drain body.

15. The chemical sensor according to claim 14, wherein:
the drain body further comprises a third drain body and a fourth drain body which are positioned on a side of the source opposite to the first drain body and the second drain body in the second direction, spaced from each other in the first direction and coupled to the drain auxiliary portion;

the light-emitting functional layer of the light emitting diode is arranged in a region between the third drain body and the fourth drain body, the first electrode of the light emitting diode is coupled to the third drain body, the fourth drain body and the drain auxiliary portion to form a planar integral structure;

the first source body is coupled to the third drain body via the semiconductor active layer, and the second source body is coupled to the fourth drain body via the semiconductor active layer; and the via hole further comprises a third via hole positioned in a region between the first source body and the third drain body, and a fourth via hole positioned in a region between the second source body and the fourth drain body.

16. The chemical sensor according to claim 9, wherein the chemically sensitive semiconductor material is one of copper phthalocyanine and pentacene.

17. A chemical sensing device, comprising:
a chemical sensing unit, comprising a thin film transistor arranged on a substrate, and a light emitting diode coupled to the thin film transistor, wherein:
the thin film transistor comprises a semiconductor active layer, a source, and a drain, and the semiconductor active layer is formed of a chemically sensitive semiconductor material;

the chemical sensing unit is provided with a via hole in a region between the source and the drain, such that the semiconductor active layer is exposed at a position corresponding to the via hole;

the light emitting diode comprises a first electrode, a light-emitting functional layer, and a second electrode which are stacked in sequence, and the first electrode is coupled to the drain;

the thin film transistor comprises a gate, a gate insulating layer, the semiconductor active layer, the source, an interlayer insulating layer, and the drain, which are sequentially arranged in a direction away from the substrate;

the source comprises a source auxiliary portion and a source body coupled to the source auxiliary portion, and the drain comprises a drain auxiliary portion and a drain body coupled to the drain auxiliary portion;

a projection of the source auxiliary portion on the substrate is overlapped with a projection of the drain auxiliary portion on the substrate, and a projection of the source body on the substrate is not overlapped with a projection of the drain body on the substrate;

both the source body and the drain body are in contact with the semiconductor active layer, and the source body is coupled to the drain body via the semiconductor active layer; and the via hole is positioned in a region between the source body and the drain body.

18. The chemical sensing device according to claim 17, further comprising a plurality of chemical sensing units arranged in a matrix; wherein the light emitting diode in each of the chemical sensing units constitutes a light emitting unit of a sub-pixel in a display panel.

* * * * *